United States Patent
Suh et al.

(10) Patent No.: US 10,056,893 B2
(45) Date of Patent: Aug. 21, 2018

(54) MOLDED POWER MODULE HAVING SINGLE IN-LINE LEADS

(71) Applicant: Alpha and Omega Semiconductor (Cayman) Ltd., Sunnyvale, CA (US)

(72) Inventors: Bum-Seok Suh, Seongnam (KR); Zhiqiang Niu, Santa Clara, CA (US); Wonjin Cho, Suwon-si (KR); Son Tran, San Jose, CA (US); James Rachana Bou, Long Beach, CA (US)

(73) Assignee: ALPHA AND OMEGA SEMICONDUCTOR (CAYMAN) LTD., Sunnyvale, CA (US)

( * ) Notice: Subject to any disclaimer, the term of this patent is extended or adjusted under 35 U.S.C. 154(b) by 12 days.

(21) Appl. No.: 15/294,778

(22) Filed: Oct. 16, 2016

(65) Prior Publication Data
US 2018/0109249 A1    Apr. 19, 2018

(51) Int. Cl.
*H01L 23/62* (2006.01)
*H03K 17/041* (2006.01)
*H01L 23/31* (2006.01)
*H01L 25/07* (2006.01)
*H01L 23/495* (2006.01)
*H01L 23/00* (2006.01)
(Continued)

(52) U.S. Cl.
CPC ........ *H03K 17/041* (2013.01); *H01L 23/3114* (2013.01); *H01L 23/49503* (2013.01); *H01L 23/49568* (2013.01); *H01L 23/49579* (2013.01); *H01L 24/45* (2013.01); *H01L 25/072* (2013.01); *H03K 17/08116* (2013.01); *H03K 17/163* (2013.01); *H01L 2224/45624* (2013.01); *H03K 2017/0806* (2013.01)

(58) Field of Classification Search
CPC ....... H01L 2924/00; H01L 2924/00014; H01L 2924/014; H01L 2224/94; H01L 2924/13091; H01L 2924/181; B67D 1/0041; B67D 1/0888; B67D 2210/00089; B67D 1/0015; B67D 1/0021; B67D 1/08; B67D 1/0878
See application file for complete search history.

(56) References Cited

U.S. PATENT DOCUMENTS 9,041,172 B1 * 5/2015 Niu .................... H01L 23/49503
257/676
2002/0134575 A1 * 9/2002 Tong ...................... H01B 17/56
174/138 G (Continued)

*Primary Examiner* — Robert Bachner
(74) *Attorney, Agent, or Firm* — Chen-Chi Lin

(57) ABSTRACT

A power module has a lead frame, a first power chip, a second power chip, a plurality of single in-line leads, a gate drive and protection integrated circuit (IC), a plurality of bonding wires and a molding encapsulation. The first and second power chips are attached to a top surface of the lead frame. The plurality of single in-line leads has a high voltage power lead, a low voltage power lead and a plurality of signal control leads. The low voltage power lead has a lead portion and an extension portion. The gate drive and protection IC is attached to the extension portion of the low voltage power lead. The molding encapsulation encloses the first and second power chips, the extension portion of the low voltage power lead, the gate drive and protection IC, the plurality of bonding wires and at least a majority portion of the lead frame.

20 Claims, 6 Drawing Sheets

(51) Int. Cl.
*H03K 17/081* (2006.01)
*H03K 17/16* (2006.01)
*H03K 17/08* (2006.01)

(56) References Cited

U.S. PATENT DOCUMENTS

2014/0284784 A1\* 9/2014 Yasunaga ................ H01L 23/52
257/690
2014/0346522 A1\* 11/2014 Disney .............. H01L 23/49575
257/76

\* cited by examiner

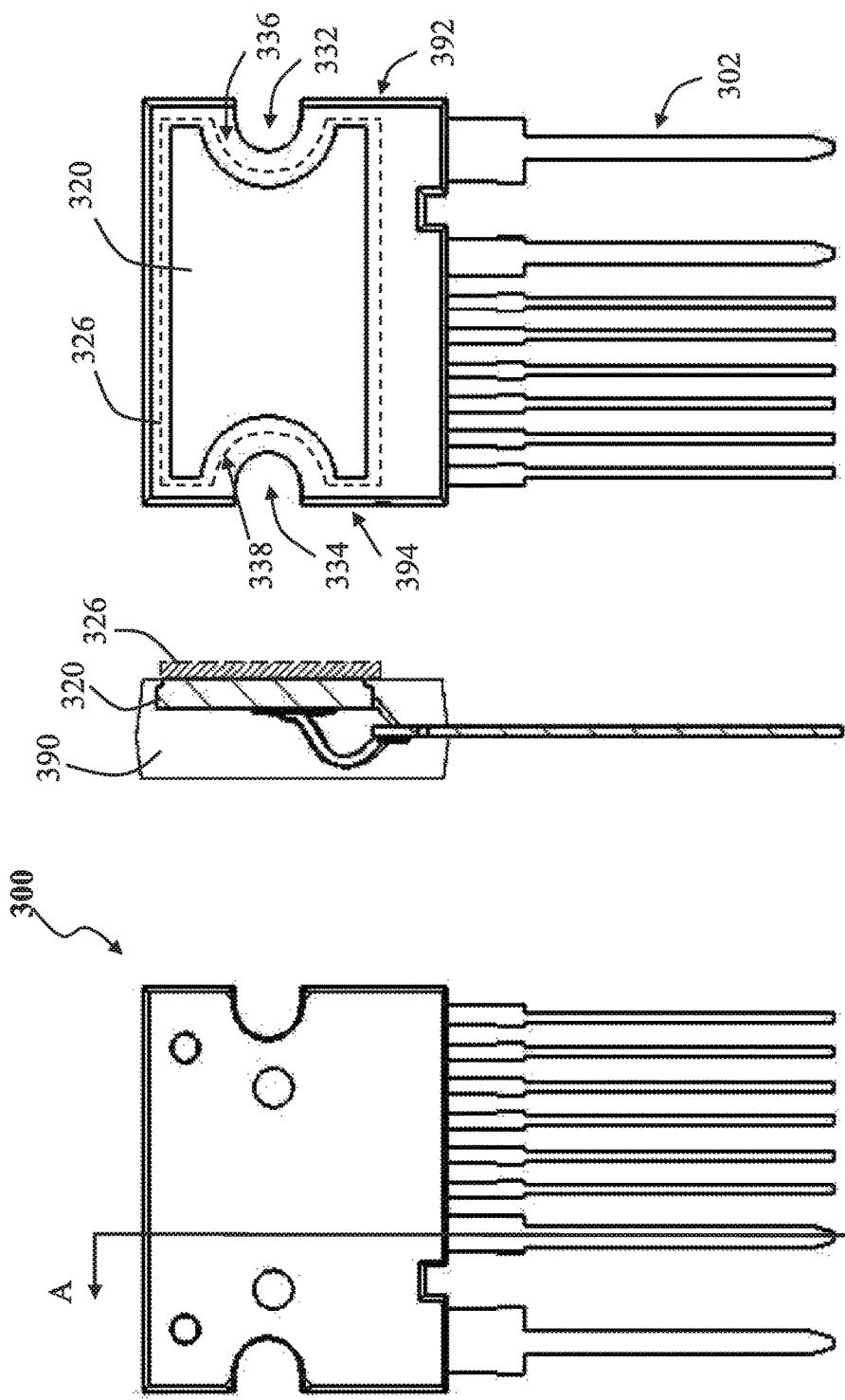

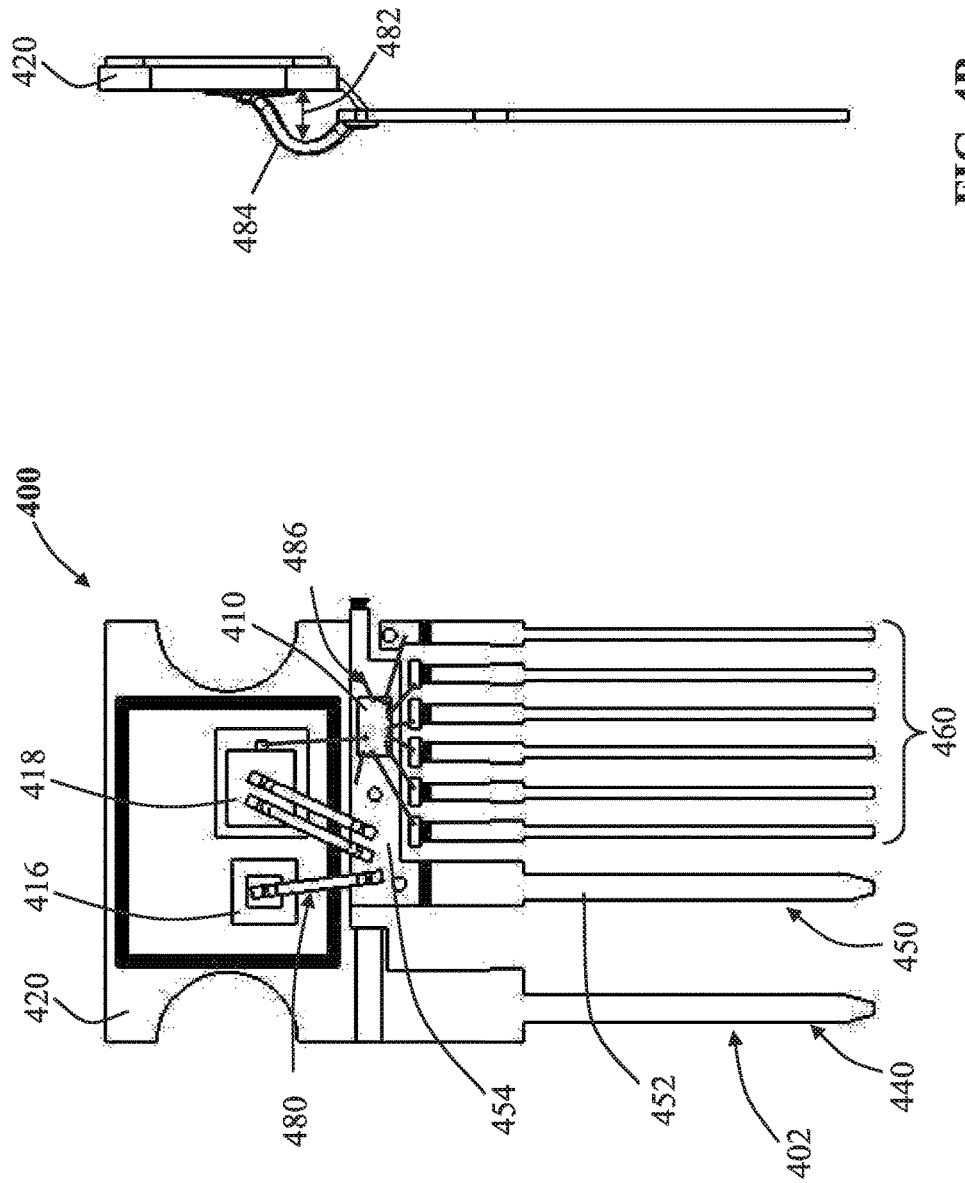

MOLDED POWER MODULE HAVING SINGLE IN-LINE LEADS

FIELD OF THE INVENTION

This invention relates generally to a molded power module having single in-line leads. More particularly, the present invention relates to a molded semiconductor power module having single in-line leads comprising a low voltage power lead including a lead portion and an extension portion.

BACKGROUND OF THE INVENTION

A conventional power module contains one or more semiconductor devices. Faster switching of the conventional power module has problems associated with high parasitic inductance. The high parasitic inductance induces voltage overshoot during fast switching. It is desirable to develop a power module having high voltage capability, over voltage protection and over temperature protection.

The advantages of the present disclosure includes fast and soft turn-off switching, high voltage and high current capability, over voltage and over temperature protection, efficient system design, improved reliability and package size reduction.

SUMMARY OF THE INVENTION

This invention discloses a power module having a die paddle, a first power chip, a second power chip, a plurality of single in-line leads, a gate drive and protection integrated circuit (IC), a plurality of bonding wires and a molding encapsulation. The first and second power chips are attached to a top surface of the die paddle. The plurality of single in-line leads has a high voltage power lead, a low voltage power lead and a plurality of signal control leads. The low voltage power lead has a lead portion and an extension portion. The gate drive and protection IC is attached to the extension portion of the low voltage power lead. The molding encapsulation encloses the first and second power chips, the extension portion of the low voltage power lead, the gate drive and protection IC, the plurality of bonding wires and at least a majority portion of the die paddle.

In examples of the present disclosure, the power module has a same body size as a standard TO247 package. The die paddle of the power module is larger than that of the standard TO247 package. More room for heat sink mounting is achieved by having single in-line leads. Double mounting screws increase power module mounting stability. The creepage distance is increased because of the introduction of an isolation cutout between the high voltage power lead and the low voltage power lead.

BRIEF DESCRIPTION OF THE DRAWINGS

FIG. 3A is a top view, FIG. 3B is a bottom view and FIG. 3C is a cross-sectional view perpendicular to AA plane of a power module in examples of the present disclosure.

FIG. 4A is a top view and FIG. 4B is a side view of a power module (with a molding encapsulation not shown) in examples of the present disclosure.

DETAILED DESCRIPTION OF THE INVENTION

Figure 1:
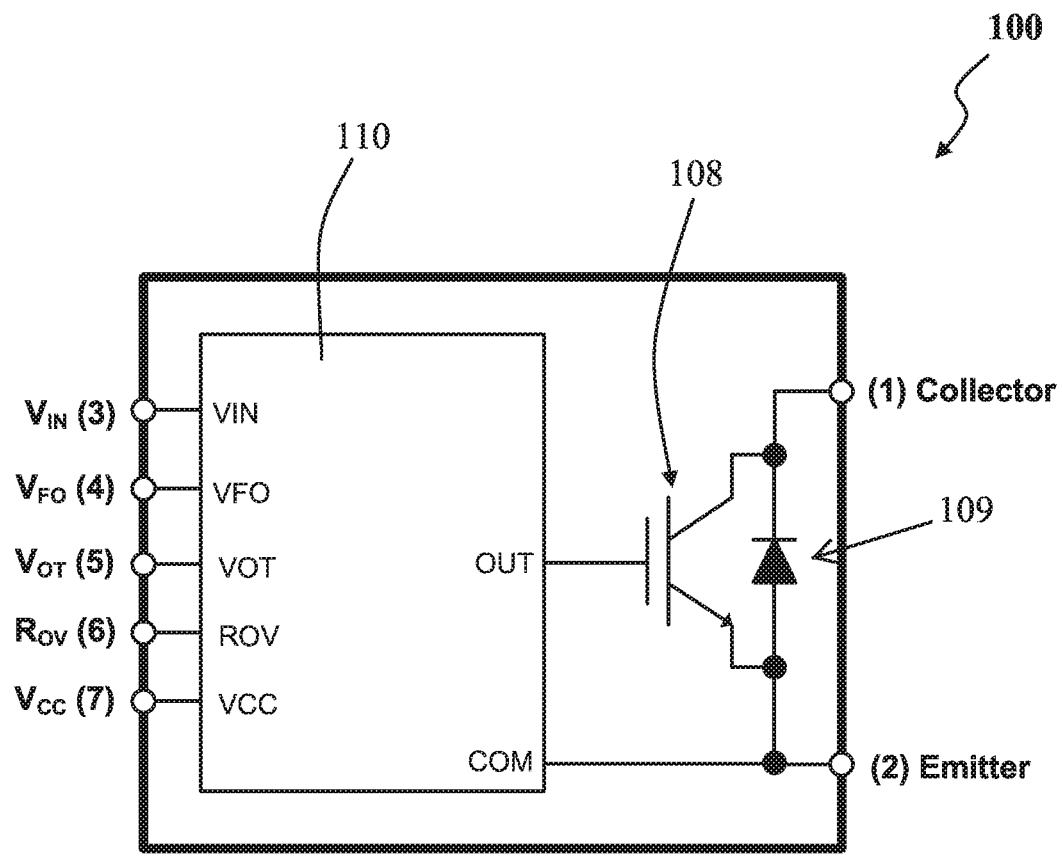
FIG. 1 is a circuit diagram of a power module in examples of the present disclosure.

FIG. 1 is a circuit diagram 100 of a power module in examples of the present disclosure. A gate drive and protection integrated circuit (IC) 110 controls an Insulated Gate Bipolar Transistor (IGBT) 108 with a diode 109 connected between the emitter and collector of the IGBT as a Free Wheel Diode (FWD).

Figure 2A:
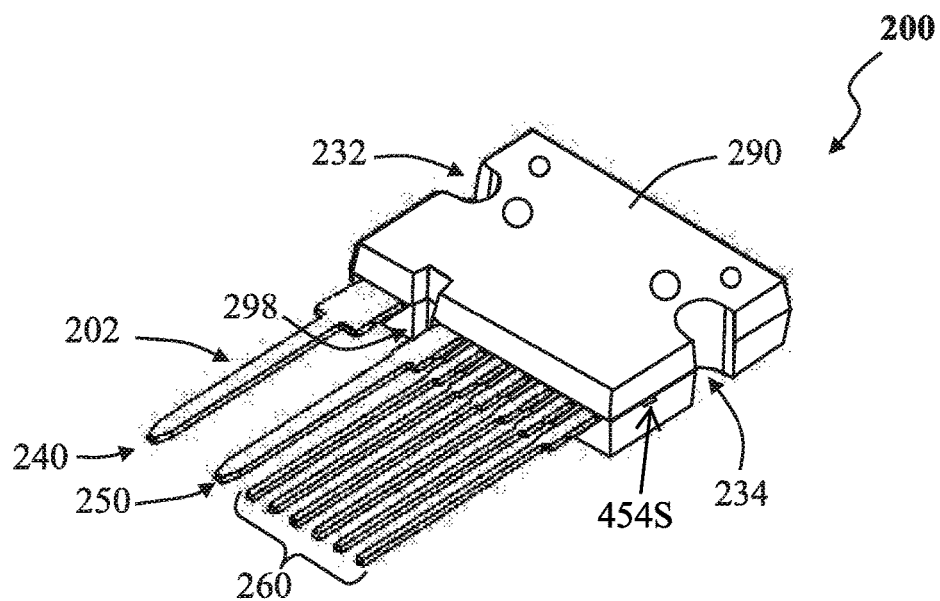
FIG. 2A is a perspective view and FIG. 2B is another perspective view of a power module in examples of the present disclosure.
Figure 2B:
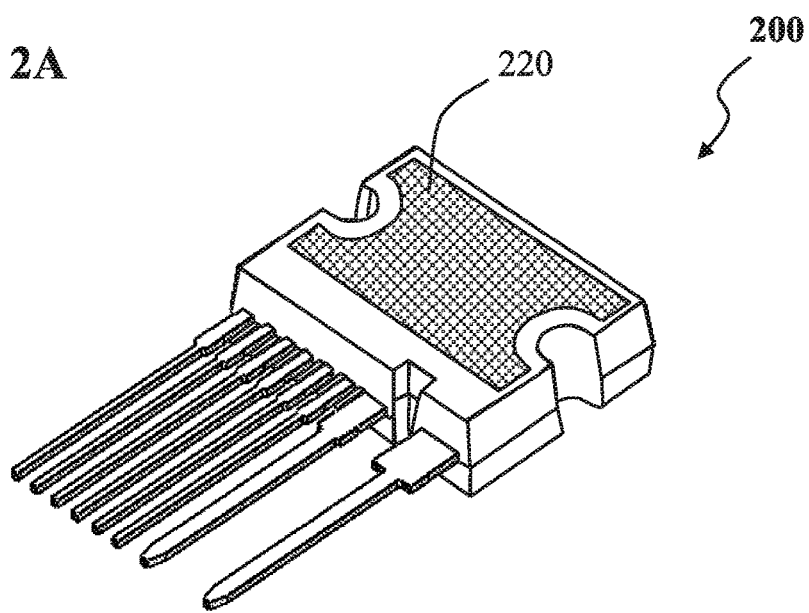

FIG. 2A is a perspective view and FIG. 2B is another perspective view of a power module 200 in examples of the present disclosure. The power module 200 has a plurality of single in-line leads 202, a die paddle 220 and a molding encapsulation 290. The plurality of single in-line leads 202 has a high voltage power lead 240, a low voltage power lead 250 and a plurality of signal control leads 260. The molding encapsulation 290 has two half-circular recesses 232 and 234 for screw mount. In examples of the present disclosure, the power module 200 is an insulated-gate bipolar transistor (IGBT). In examples of the present disclosure, a body of the power module 200 is of a same size of a TO247 package. In examples of the present disclosure, a bottom surface of the die paddle 220 is exposed from the molding encapsulation 290.

In examples of the present disclosure, the molding encapsulation 290 has an isolation cutout 298 between the high voltage power lead 240 and the low voltage power lead 250. Therefore, the creepage distance is increased.

FIG. 3A is a top view, FIG. 3B is a bottom view and FIG. 3C is a cross-sectional view perpendicular to AA plane of a power module 300 in examples of the present disclosure. The power module 300 has a plurality of single in-line leads 302, a die paddle 320, an optional heat sink 326 (shown in dashed lines) and a molding encapsulation 390. The optional heat sink 326 is directly attached to the exposed bottom surface of the die paddle 320. The molding encapsulation 390 has two half-circular recesses 332 and 334 for screw mount. The optional heat sink 326 has two half-circular recesses 336 and 338 for screw mount. The half-circular recess 336 is aligned with the half-circular recesses 332. The half-circular recess 338 is aligned with the half-circular recesses 334.

In examples of the present disclosure, the molding encapsulation 390 is of a rectangular prism shape. The molding encapsulation 390 has a first side surface 392 and a second side surface 394 opposing the first side surface 392. The first half-circular recess 332 is near the first side surface 392 of the molding encapsulation 390. The second half-circular recess 334 is near the second side surface 394 of the molding encapsulation 390.

FIG. 4A is a top view and FIG. 4B is a side view of a power module 400 (with a molding encapsulation 390 of FIG. 3C not shown) in examples of the present disclosure. The power module 400 has a die paddle 420, a first power chip 416, a second power chip 418, a plurality of single in-line leads 402, a gate drive and protection IC 410, a plurality of bonding wires 480 and a molding encapsulation 390 of FIG. 3C.

The first and second power chips 416 and 418 are attached to a top surface of the die paddle 420. In examples of the present disclosure, the first power chip 416 is a vertical diode having its cathode at a bottom surface of the first power chip 416. The cathode of the first power chip 416 is electrically connected to the die paddle 420. The second power chip 418 is an IGBT having a bottom collector electrode electrically connected to the die paddle 420. The plurality of single in-line leads 402 has a high voltage power lead 440 connected to the die paddle 420, a low voltage power lead 450 adjacent to the high voltage power lead 440 and a plurality of signal control leads 460 displaced away from the high voltage power lead 440. The low voltage power lead 450 has a lead portion 452 and an extension portion 454. The lead portion 452 and the extension portion 454 are separated from the die paddle 420. The lead portion 452 of the low voltage power lead 450 is generally parallel to the high voltage power lead 440. The high voltage power lead 440 and the extension portion 454 are on opposite sides of the lead portion 452. The extension portion 454 of the low voltage power lead 450 is between the die paddle 420 and the plurality of signal control leads 460. The extension portion 454 of the low voltage power lead 450 is generally perpendicular to the lead portion 452 of the low voltage power lead 450. The extension portion 454 of the low voltage power lead 450 is separated from the plurality of signal control leads 460. One end of the extension portion 454 is connected to the lead portion 452. Another end of the extension portion 454 extends beyond an edge of the plurality of signal control leads 460. The extension portion 454 functions as a tie bar. The gate drive and protection IC 410 is attached to the extension portion 454 of the low voltage power lead 450.

The molding encapsulation 390 of FIG. 3C encloses the first and second power chips 416 and 418, the extension portion 454 of the low voltage power lead 450, the gate drive and protection IC 410, the plurality of bonding wires 480 and at least a majority portion of the die paddle 420. An end face 454S of FIG. 2A of the extension portion 454 of the low voltage power lead 450 is exposed from a side face of the molding encapsulation 390 opposite the high voltage power lead 440.

The extension portion 454 of the low voltage power lead 450 is between the die paddle 420 and the plurality of signal control leads 460.

The plurality of bonding wires 480 electrically connect the first and second power chips 416 and 418 to the low voltage power lead 450. In examples of the present disclosure, the bond wires 480 are connected to an area of the extension portion 454 of the low voltage power lead 450 close to the lead portion 452 of the low voltage power lead 450. In examples of the present disclosure, another plurality of bonding wires 486 electrically connect the gate drive and protection IC 410 to the second power chip 418, the low voltage power lead 450 and the plurality of signal control leads 460. The other plurality of bonding wires 486 is embedded in the molding encapsulation 390 of FIG. 3C.

In examples of the present disclosure, a thickness of the die paddle 420 is larger than a thickness of each of the plurality of single in-line leads 402. A width of the high voltage power lead 440 is larger than a width of each of the plurality of signal control leads 460. A width of the lead portion 452 of the low voltage power lead 450 is larger than a width of each of the plurality of signal control leads 460. A pitch between the high and low voltage power leads 440 and 450 is larger than a pitch between adjacent signal control leads of the plurality of signal control leads 460.

In examples of the present disclosure, the lead frame including the die paddle 420 and the leads 440, 450 and 460 is a dual gauge copper lead frame. The plurality of bonding wires 480 are aluminum wires. The low voltage power lead 450 is a single-piece constructed assembly.

A pre-determined lower bound limit of a maximum vertical distance 482 between a selected bonding wire 484 of the plurality of bonding wires 480 and the die paddle 420 is a function of an insulation property of the molding encapsulation 390 of FIG. 3C. The pre-determined lower bound limit increases as the insulation property of the molding encapsulation 390 of FIG. 3C decreases (the thermal conductivity of the molding encapsulation 390 of FIG. 3C increases). In examples of the present disclosure, the pre-determined lower bound limit is 3 mm when the thermal conductivity of the molding encapsulation 390 of FIG. 3C is 0.7 watt per meter kelvin. The pre-determined lower bound limit is 4 mm when the thermal conductivity of the molding encapsulation 390 of FIG. 3C is 0.8 watt per meter kelvin.

Figure 5:
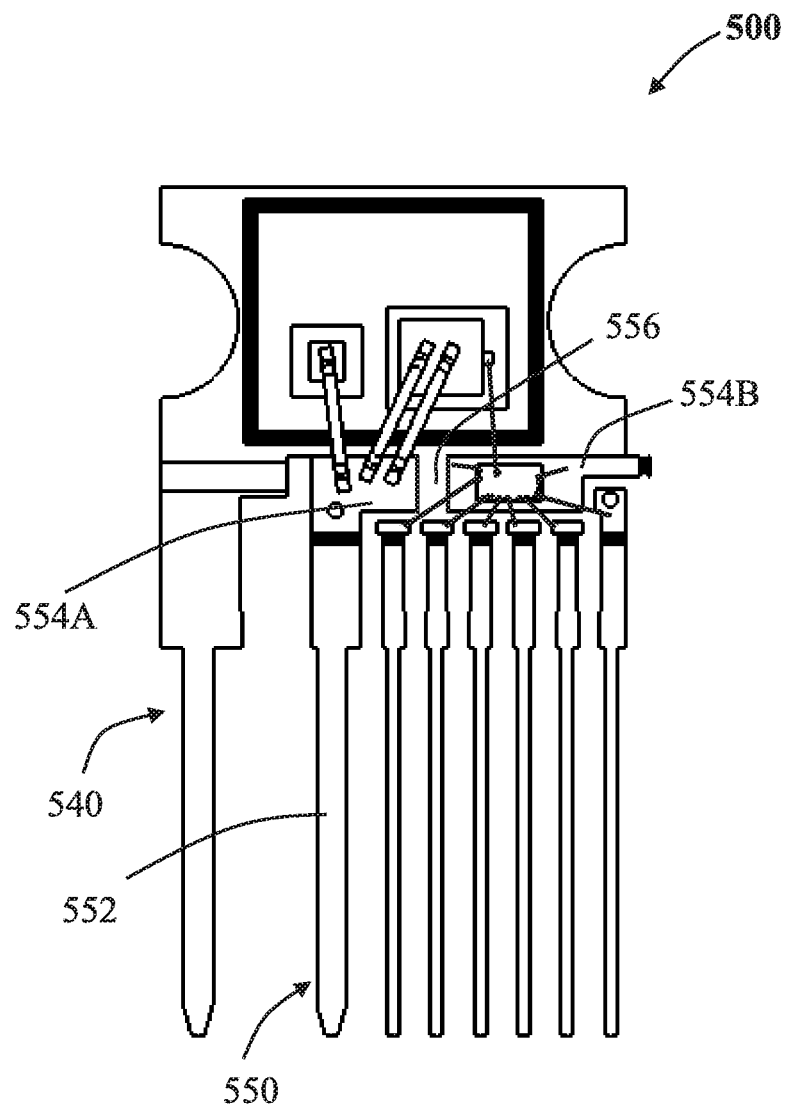
FIG. 5 is a top view of another power module (with a molding encapsulation not shown) in examples of the present disclosure.

FIG. 5 is a top view of a power module 500 (with a molding encapsulation not shown) in examples of the present disclosure. The power module 500 has a low voltage power lead 550. The power module 500 is similar to the power module 400 except that the low voltage power lead 550 is a two-piece constructed assembly. The low voltage power lead 550 has a lead portion 552 and an extension portion. The lead portion 552 of the low voltage power lead 550 is generally parallel to the high voltage power lead 540. The extension portion of the low voltage power lead 550 is generally perpendicular to the lead portion 552 of the low voltage power lead 550. The extension portion of the low voltage power lead 550 is divided by a space 556 into two separated sub-portions 554A and 554B. The sub-portion 554A is connected to the lead portion 552. The portion 554B extends beyond an edge of the plurality of signal control leads functioning as a tie bar. The gate drive and protection IC 410 is attached to the extension portion 554B separated from the low voltage power lead 550. The plurality of bonding wires 480 electrically connect the first and second power chips 416 and 418 to the low voltage power lead 550 at the sub-portion 554A.

Figure 6B:
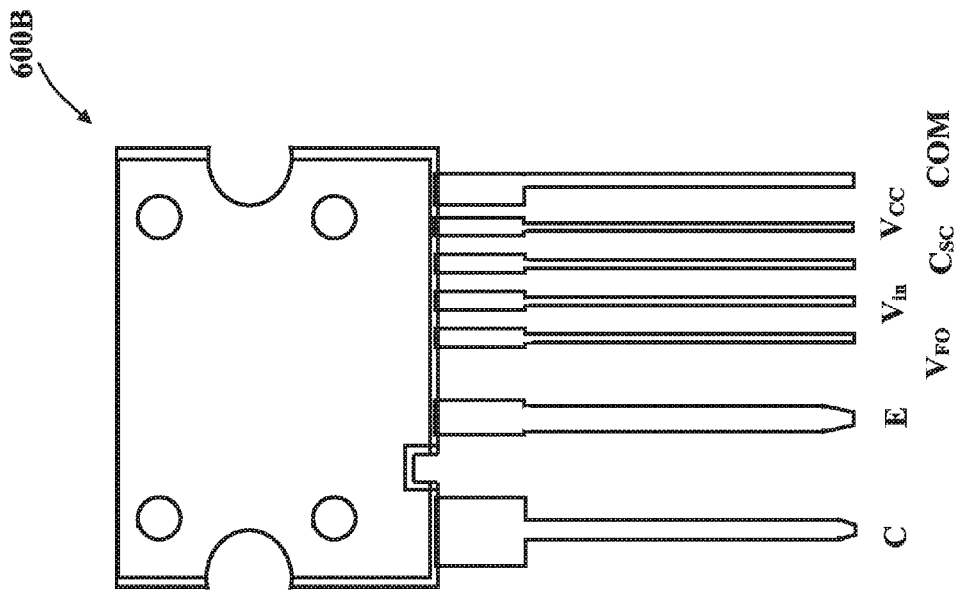
FIG. 6A is a top view of a power module and FIG. 6B is a top view of another power module in examples of the present disclosure.
Figure 6A:
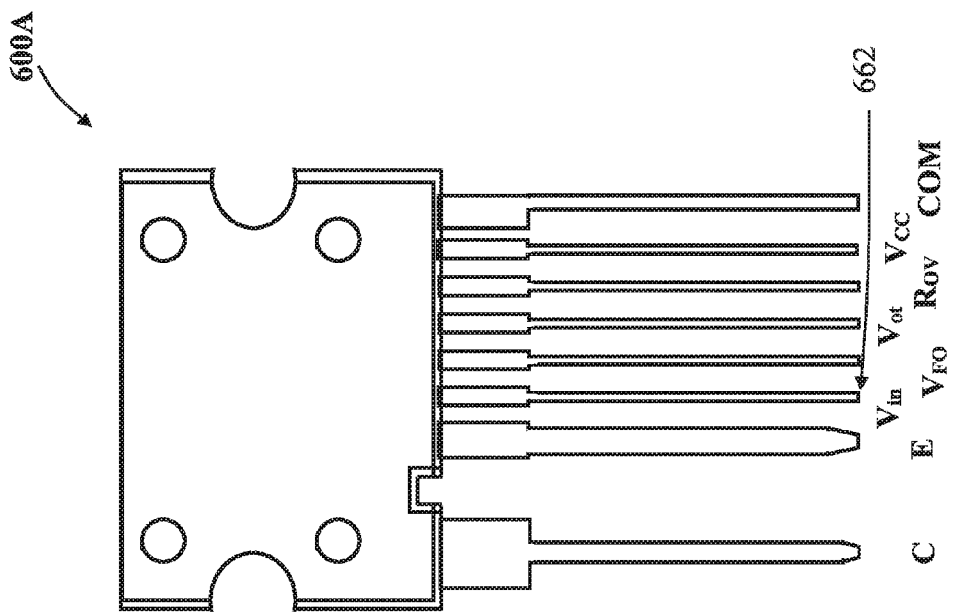

FIG. 6A is a top view of a power module 600A and FIG. 6B is a top view of another power module 600B in examples of the present disclosure. The power module 600A has one more lead 662 than the power module 600B. The power module 600A has a high voltage power lead (C), a low voltage power lead (E), a voltage-in lead (Vin), a vault output lead ($V_{FO}$), a voltage-out lead (Vot), a resistor lead (Rov), a common bias voltage lead (Vcc) and a ground lead (COM). The power module 600B has a high voltage power lead (C), a low voltage power lead (E), a vault output lead ($V_{FO}$), a voltage-in lead (Vin), a capacitor for over-current detection lead (Csc), a common bias voltage lead (Vcc) and a ground lead (COM).

Those of ordinary skill in the art may recognize that modifications of the embodiments disclosed herein are possible. For example, the number of power chips may vary. The number of signal control leads may vary. Other modifications may occur to those of ordinary skill in this art, and all such modifications are deemed to fall within the purview of the present invention, as defined by the claims.

The invention claimed is:

1. A power module comprising:
    a die paddle;
    one or more power chips attached to a top surface of the die paddle;
    a plurality of single in-line leads including a high voltage power lead, a low voltage power lead and a plurality of signal control leads, the low voltage power lead having a lead portion generally parallel to the high voltage power lead and an extension portion generally perpendicular to the lead portion;

a gate drive and protection integrated circuit (IC) attached to the extension portion of the low voltage power lead;

a plurality of bonding wires; and a molding encapsulation enclosing the one or more power chips, the extension portion of the low voltage power lead, the gate drive and protection IC, the plurality of bonding wires and at least a majority portion of the die paddle;

wherein the extension portion of the low voltage power lead is between the die paddle and the plurality of signal control leads.

2. The power module of claim 1, wherein one of the one or more power chips is an insulated-gate bipolar transistor (IGBT).

3. The power module of claim 1, wherein a bottom surface of the die paddle is exposed from the molding encapsulation.

4. The power module of claim 3, wherein a heat sink is directly attached to the exposed bottom surface of the die paddle.

5. The power module of claim 4, wherein the molding encapsulation has a first and second screw mounting cutouts;

wherein the heat sink has a third and fourth screw mounting cutouts;

wherein the third screw mounting cutout is aligned with the first screw mounting cutout; and wherein the fourth screw mounting cutout is aligned with the second screw mounting cutout.

6. The power module of claim 1, wherein a body of the power module is of a same size of a TO247 package.

7. The power module of claim 1, wherein the molding encapsulation is of a rectangular prism shape;

wherein the molding encapsulation has a first side surface and a second side surface opposing the first side surface;

wherein a first screw mounting cutout is near the first side surface of the molding encapsulation; and wherein a second screw mounting cutout is near the second side surface of the molding encapsulation.

8. The power module of claim 1, wherein the molding encapsulation has an isolation cutout between the high and low voltage power leads of the plurality of single in-line leads.

9. The power module of claim 1, wherein a thickness of the die paddle is larger than a thickness of each of the plurality of single in-line leads.

10. The power module of claim 1, wherein a width of the high voltage power lead is larger than a width of each of the plurality of signal control leads.

11. The power module of claim 1, wherein a width of the lead portion of the low voltage power lead is larger than a width of each of the plurality of signal control leads.

12. The power module of claim 1, wherein a pitch between the high and low voltage power leads is larger than a pitch between adjacent signal control leads of the plurality of signal control leads.

13. The power module of claim 1 further comprising a lead frame including the die paddle and the plurality of single in-line leads, wherein the lead frame is a dual gauge copper lead frame.

14. The power module of claim 1, wherein the plurality of bonding wires are aluminum wires.

15. The power module of claim 1, wherein the low voltage power lead is a single-piece constructed assembly.

16. The power module of claim 1, wherein the low voltage power lead is a two-piece constructed assembly and wherein the extension portion of the low voltage power lead has a first portion connected to the lead portion of the low voltage power lead and a second portion separated from the first portion.

17. The power module of claim 1, wherein the gate drive and protection IC is directly mounted on a top surface of the extension portion of the low voltage power lead;

wherein a width of the extension portion of the low voltage power lead is larger than a width of the gate drive and protection IC; and wherein a length of the extension portion of the low voltage power lead is larger than a length of the gate drive and protection IC.

18. The power module of claim 1, wherein a pre-determined lower bound limit of a maximum vertical distance between a selected bonding wire of the plurality of bonding wires and the die paddle is a function of an insulation property of the molding encapsulation;

wherein the pre-determined lower bound limit increases as the insulation property of the molding encapsulation decreases;

wherein the pre-determined lower bound limit is three millimeters mm when a thermal conductivity of the molding encapsulation is 0.7 watt per meter kelvin; and wherein the pre-determined lower bound limit is four millimeters when the thermal conductivity of the molding encapsulation is 0.8 watt per meter kelvin.

19. The power module of claim 1, wherein the one or more power chips comprises a first power chip; and a second power chip;

wherein the first power chip is a vertical diode having a cathode at a bottom surface of the first power chip;

wherein the cathode of the first power chip is electrically connected to the die paddle;

wherein the second power chip is an insulated-gate bipolar transistor (IGBT) having a bottom collector electrode electrically connected to the die paddle;

wherein the high voltage power lead is connected to the die paddle;

wherein the low voltage power lead is adjacent to the high voltage power lead;

wherein the plurality of signal control leads are displaced away from the high voltage power lead;

wherein the high voltage power lead and the extension portion are on opposite sides of the lead portion;

wherein the extension portion has a first end; and a second end;

wherein the first end of the extension portion is connected to the lead portion;

wherein the second end of the extension portion extends beyond an edge of the plurality of signal control leads;

wherein a first subset of the plurality of bonding wires electrically connect the first power chip and the second power chip to the low voltage power lead; and wherein a second subset of the plurality of bonding wires electrically connect the gate drive and protection IC to the second power chip, the low voltage power lead and the plurality of signal control leads 460.

20. A power module comprising:

a die paddle;

one or more power chips attached to a top surface of the die paddle;

a plurality of single in-line leads including a high voltage power lead, a low voltage power lead and a plurality of signal control leads, the low voltage power lead having a lead portion generally parallel to the high voltage power lead and an extension portion generally perpendicular to the lead portion;

a gate drive and protection integrated circuit (IC) attached to the extension portion of the low voltage power lead;

a plurality of bonding wires; and a molding encapsulation enclosing the one or more power chips, at least a majority portion of the extension portion of the low voltage power lead, the gate drive and protection IC, the plurality of bonding wires and at least a majority portion of the die paddle;

wherein the extension portion of the low voltage power lead is between the die paddle and the plurality of signal control leads; and wherein an end face of the extension portion of the low voltage power lead is exposed from a side face of the molding encapsulation.

* * * * *